United States Patent [19]
Barnett et al.

[11] Patent Number: 5,656,387
[45] Date of Patent: Aug. 12, 1997

[54] SOLID-OXIDE FUEL CELLS HAVING NICKEL AND YTTRIA-STABILIZED ZIRCONIA ANODES AND METHOD OF MANUFACTURE

[75] Inventors: Scott Alexander Barnett, Evanston; Tsepin Tsai, Chicago, both of Ill.

[73] Assignee: Northwestern University, Evanston, Ill.

[21] Appl. No.: 574,499

[22] Filed: Dec. 19, 1995

Related U.S. Application Data

[60] Provisional application No. 60/005,278, Oct. 10, 1995.
[51] Int. Cl.$^6$ ................................................. H01M 4/88
[52] U.S. Cl. ................................ 429/33; 429/40; 429/44
[58] Field of Search ............................... 429/30, 33, 40, 429/44

[56] References Cited

PUBLICATIONS

T. Kawada, N. Sakai, H. Yokokawa, M. Dokiya, M. Mori & T. Iwata, *J. Electrochem. Soc.* 137, 217 (1990) (month n/a).
T. Setoguchi, T. Inoue, H. Takebe, K. Eguchi, K. Morinaga, and H. Arai, *Solid State Ionics* 37, 217 (1990) (month n/a).
T. Setoguchi, K. Okamoto, K. Eguchi, and H. Arai, *J. Electrochem. Soc.* 139, 2875 (1992) (no month).
T. Kawada, N. Sakai, H. Yokokawa, M. Doiya, M. Mori, and T. Iwata, *Solid State Ionics* 40/41, 402 (1993) (month n/a).
D. W. Dees, U. Balachandran, S. E. Dorris, J. E. Heiberger, C. C. McPheeters and J. J. Picciolo, *Proc. 3rd Int. Symp. Solid-Oxide Fuel Cells*, edited by S. C. Singhal (Electrochemical Society, Pennington, NJ, 1989), vol. 89-11, p. 317 (month n/a).
A. O. Isenberg, *Solid State Ionics* 3/4, 431 (1981) (month n/a).
E. Iver-Tiff, W. Wersing, M. Schiessel and H. Greiner, *Ber Bunsendes. Phys. Chem.* 94, 978 (1990) (month n/a).
L.S. Wang and S.A. Barnett, *Solid State Ionics* 61, 273 (1993) (month n/a).
N. Nakagawa, H. Yoshioka and M. Ishida, *Solid State Ionics* 35, 249 (1989) (month n/a).
S.A. Barnett, *Energy* 15, 1 (1990) (month n/a).
L.S. Wang and S.A. Barnett, *J. Electrochem. Soc.* 139, 1134 (1992) (month n/a).
D.W. Dees, T.D. Claar, T.E. Easler, D.C. Fee, and F.C. Mrazek, *J. Electrochem. Soc.* 134, 2141 (1992) (month n/a).
B.A. Boukamp, I.C. Vinke, K. Seshan, K.J. De Vries and A.J. Burggraaf, *Solid State Ionics* 28–30, 1187 (1988) (month n/a).
S. Nakahara, *Thin Solid Films* 64, 149 (1979) (month n/a).
K. Okumura, Y. Yamamoto, T. Fukui, S. Hanyu, Y. Kubo, Y. Esaki, M. Hattori, A. Kusunoki and S. Takeuchi, *Proc. 3rd Int. Symp. Solid–Oxide Fuel Cells*, edited by S. C. Singhal & H. Iwahara (Electrochemical Society, Pennington, NJ, 1993), vol. 93-4, p. 444 (month n/a).
J. Misusaki, H. Tagawa, T. Saito, K. Kamitani, T. Yamamura, K. Hirano, S. Ehara, T. Takagi, T. Hikita, M. Ippommatsu, S. Nakagawa, and K. Hashimoto, *Proc. 3rd Int. Symp. Solid–Oxide Fuel Cells*, edited by S. C. Singhal & Iwahara (Electochemical Society, Pennington, NJ, 1993), vol. 93-4, p. 533 (month n/a).
I.D. Raistrick, *Impedance Spectroscopy*, edited by J. R. Macdonald (John Wiley, New York, 1987), p. 56 (month n/a).

*Primary Examiner*—M. Nuzzolillo
*Attorney, Agent, or Firm*—Flehr, Hohbach, Test, Albritton & Herbert

[57] ABSTRACT

There is disclosed a solid-oxide fuel cell having an improved nickel and yttrium-stabilized zirconia anode.

5 Claims, 8 Drawing Sheets

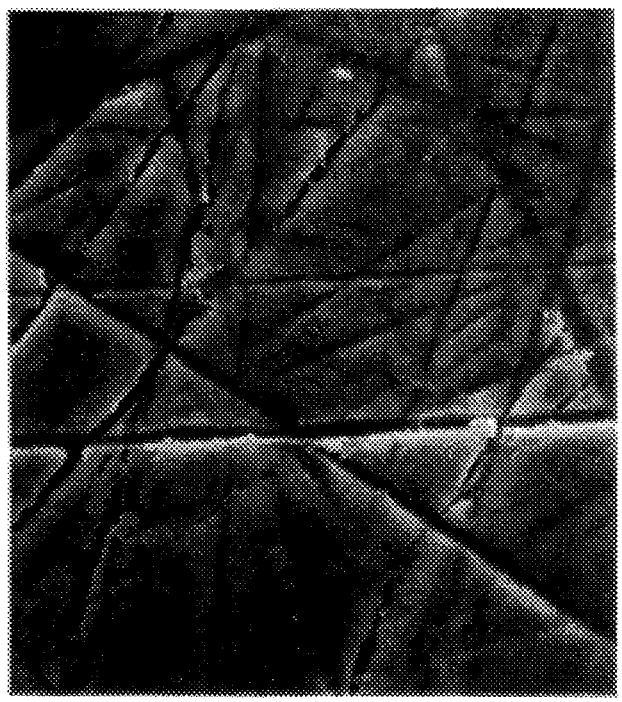
3 μm
FIG.—2A
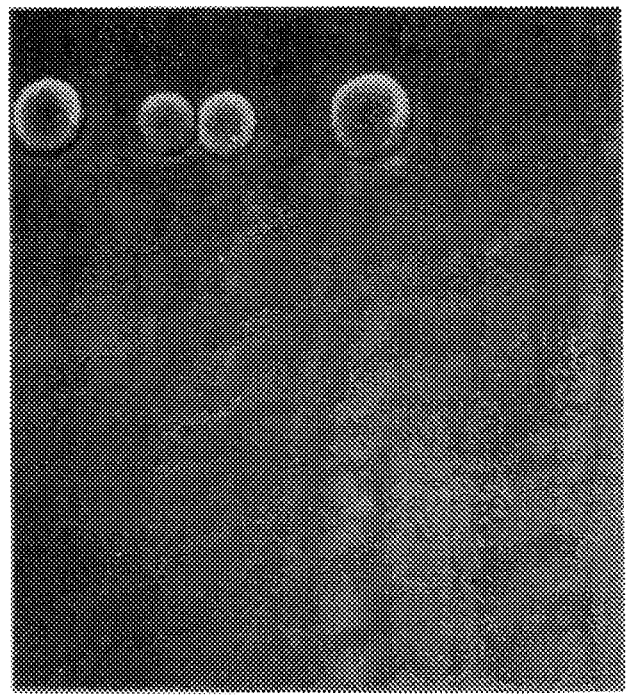
3 μm
FIG.—2B

3 μm

3 μm

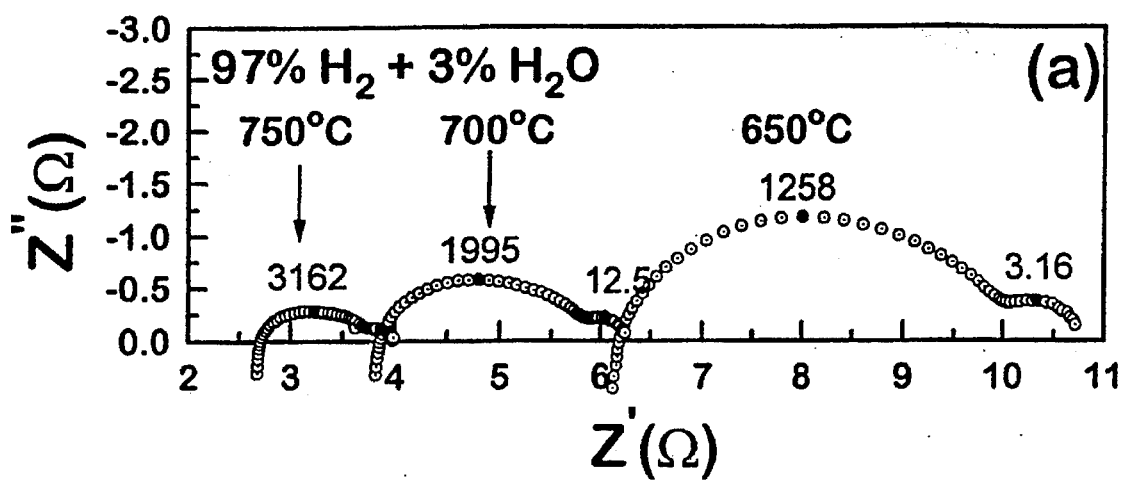
FIG.—5A
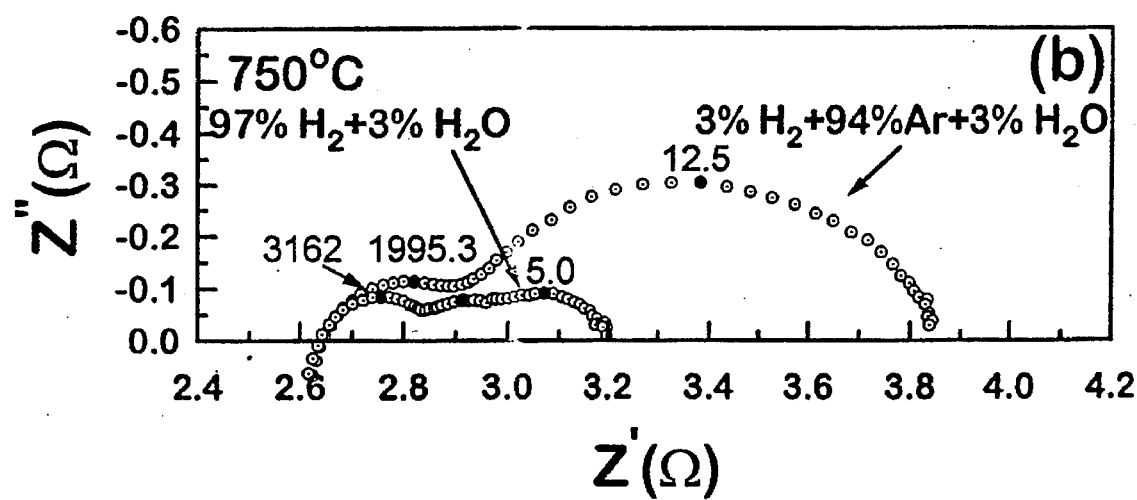
FIG.—5B

SOLID-OXIDE FUEL CELLS HAVING NICKEL AND YTTRIA-STABILIZED ZIRCONIA ANODES AND METHOD OF MANUFACTURE

REFERENCE TO RELATED APPLICATION

This application claims the priority of provisional application Ser. No. 60/005,278 filed Oct. 10, 1995, entitled Nickel and Yttria-stabilized Zirconia Anodes Having Solid-oxide Fuel Cells and Method of Manufacture.

BRIEF DESCRIPTION OF THE INVENTION

This invention relates generally to solid-oxide fuel cell anodes and more particularly to nickel and yttria-stabilized zirconia anodes for such fuel cells.

BACKGROUND OF THE INVENTION

Solid-oxide fuel cells (SOFC's) generally comprise a solid electrolyte such as yttria-stabilized zirconia (YSZ) with a positive air electrode, such as described in co-pending application Ser. No. 08/408,953 filed Mar. 22, 1995, on one surface of the electrolyte and a negative fuel electrode (anode) such as a cermet of nickel and stabilized zirconia on the other surface of the electrolyte. In the prior art the anodes have been composed of bulk Ni and YSZ (Ni—YSZ). The main reasons for using Ni—YSZ anodes are the reasonable cost of the materials, the stability and excellent catalytic activity of Ni in fuel gas environments, and the fact that a high density of three-phase boundaries are formed in the cermet, increasing electrochemical reaction rates[1]. There are several problems with Ni—YSZ, however, including sintering and segregation of Ni out of the two-phase structure[2], performance loss in the presence of sulphur contamination[3], and poor thermal expansion match with YSZ at high Ni contents[4]. Interfacial reaction kinetics are strongly dependent on the microstructures, i.e. the three-phase boundary length, as determined by the method of fabricating the Ni—YSZ and the YSZ[1,5].

Several groups have recently reported results on SOFC's employing thin (~10 μm) Y-stabilized zirconia (YSZ) electrolytes[6,7]. One of the main advantages of these thin-film-electrolyte cells is that the electrolyte ohmic resistance is low enough at 600°– 800° C. for efficient SOFC operation. Reducing the cell operating temperature $T_c$ has been widely discussed as a means for easing materials and processing problems associated with interconnection and gas sealing in SOFC stacks[8]. At $T_c \approx 600°$–800° C., however, thermally-activated electrochemical reaction rates decrease, increasing electrode interfacial resistance $r_i$ and limiting the SOFC power density. While new methods for improving air-electrode performance have recently been developed[9], very little is known about Ni—YSZ in this $T_c$ range.

OBJECTS AND SUMMARY OF THE INVENTION

It is a general object of this invention to provide an improved Ni—YSZ anode for SOFC's.

It is another object of the invention to provide a porous Ni—YSZ anode for SOFC's and method of making the anode.

It is a further object to provide a porous two-phase small grain size Ni—YSZ anode for SOFC's having improved sintering and segregation characteristics.

The foregoing and other objects of the invention are achieved by a solid-oxide fuel cell for operation in the 600°–800° C. temperature range having a solid electrolyte with a porous film providing a positive air electrode on one surface of the electrolyte and a porous nickel and yttria-stabilized zirconia anode film having low interfacial resistance on the other surface, providing the fuel electrode (anode), the anode film being deposited by DC reactive magnetron sputtering from a metallic nickel-zirconium-yttrium (Ni—Z—Y) target in an Ar—$O_2$ atmosphere.

BRIEF DESCRIPTION OF THE DRAWINGS

The foregoing and other objects of the invention will be more clearly understood from the following description when read in conjunction with the accompanying drawings, wherein:

FIG. 5 is a plot of the imaginary versus real impedance of typical Ni—YSZ films on YSZ for (a) different temperatures and (b) $H_2$ content (the numbers shown indicate the frequencies (Hz) at the tops of the arcs)

DESCRIPTION OF PREFERRED EMBODIMENT

Figure 1:
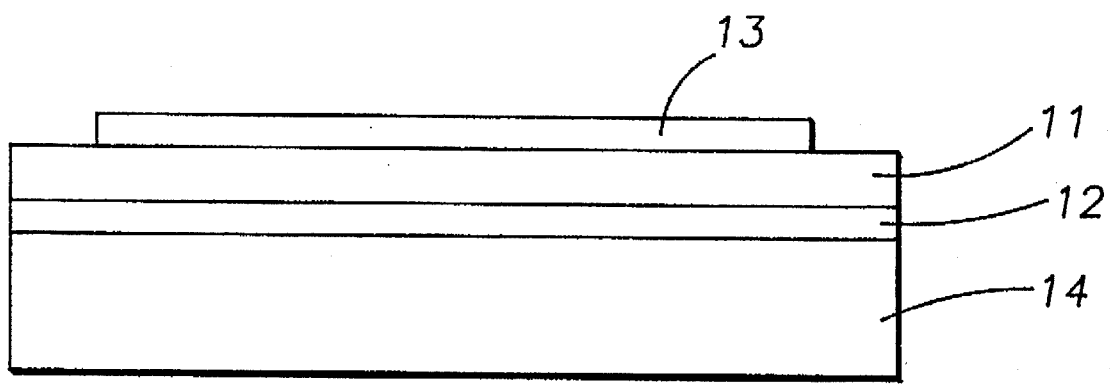
FIG. 1 is a schematic representation of a thin film SOFC supported on a porous substrate.

FIG. 1 is a schematic representation of a thin film SOFC. The cell includes a solid electrolyte 11 such as YSZ, an air or positive electrode film 12 which may be fabricated in accordance with the teaching of co-pending application Ser. No. 08/408,953 filed Mar. 22, 1995 and a negative fuel electrode film (anode) 13 fabricated in accordance with this invention. The fuel cell is supported on a porous substrate 14. In accordance with the invention, the anode 13 is a porous Ni—YSZ composition formed by DC reactive magnetron sputtering from a single metallic source.

In order to determine the electrochemical properties of Ni—YSZ films formed in accordance with the invention, films were deposited on single crystal YSZ substrates (10 mole % $Y_2O_3$-stabilized $ZrO_2$) with polished or intentionally roughened surfaces. The roughened surfaces were produced by using SiC paper (grit #600, particle size of 25 μm). A typical toughened surface is shown in FIG. 2A. All substrates were ultrasonically cleaned with dichloroethane, acetone, and methanol before each deposition.

A DC reactive magnetron sputtering system has been described elsewhere[10]. In demonstrating the invention the targets were 5 cm in diameter and 7.5 cm away from the substrates. Metallic targets were sputtered in Ar—$O_2$ mixtures with an $O_2$ partial pressure of 0.6 mT and a total pressure P of 20 or 40 mT. While no intentional substrate heating was used, the substrate temperature $T_s$ normally rose to ≈70° C. due to plasma heating. The films were deposited from a single Ni—Zr—Y metal alloy sputtering target with a composition (68.8 wt % Ni, 26.6 wt % Zr, 4.52 Wt % Y) chosen to achieve Ni (50 vol %)-YSZ films with the YSZ containing 10 mol % $Y_2O_3$. This metal alloy cermet composition is non-magnetic, which is useful since the target will not disturb the magnetic field of the magnetron source. A pre-sputtering period of ~1 hour was used for new targets to ensure steady state sputtering. Typical film deposition rates were ≈3 μm/hr using a target voltage of ≈350 V and a current of 0.4 A.

This resulted in a composition of 50 vol % Ni and 50 vol % YSZ. The vol % of Ni should be in the range of 30 to 60 vol % Ni. This is above the threshold composition, ≈30 vol % Ni, where the electrical conductivity σ becomes appreciable, and should give σ~$10^3$ $Ω^{-1}cm^{-1}$ at 1000° C.[10]. The thermal expansion coefficient α for 50 vol Ni is ≈$13 \times 10^{-6}$ $K.^{-1}$[7], larger than that of the YSZ electrolyte (α=$10.5 \times 10^{-6}$ $K.^{-1}$).

The films formed in accordance with the foregoing were analyzed by conducting various tests. Impedance spectroscopy was carried out using a Solarton SI 1260 Frequency Response Analyzer over the frequency range of 100 Khz to 0.1 Hz using a ±6 mV excitation signal. Most of the tests were carried out at 600°~750° C. under reducing atmospheres: pure $H_2$ or forming gas (3% $H_2$+97% Ar) bubbled through pure water at 25° C. Samples were prepared by depositing 2 μm thick Ni—YSZ electrodes symmetrically on both sides of a YSZ substrate. Deposition conditions are listed in Table I. The sample geometry included a reference electrode at the edge of the sample for characterizing individual interfaces, similar to typical electrochemical measurement configurations[11]. Connections to the electrode films were made using Ag leads attached using Ni-based high-temperature cement. The high-frequency arcs due to bulk electrolyte conductivity are not shown in the results, and grain-boundary arcs were not present because single-crystal YSZ was used.

A scanning electron microscope (SEM) equipped with an energy dispersive x-ray (EDX) spectroscopy system was used to examine film morphologies and compositions. A Hitachi H-700H transmission electron microscope was used to observe the microstructure of Ni—YSZ cermet films that had been thinned by grinding and ion milling to electron transparency.

The results of the tests are analyzed below:

A. Morphology and structure

Figure 2C:
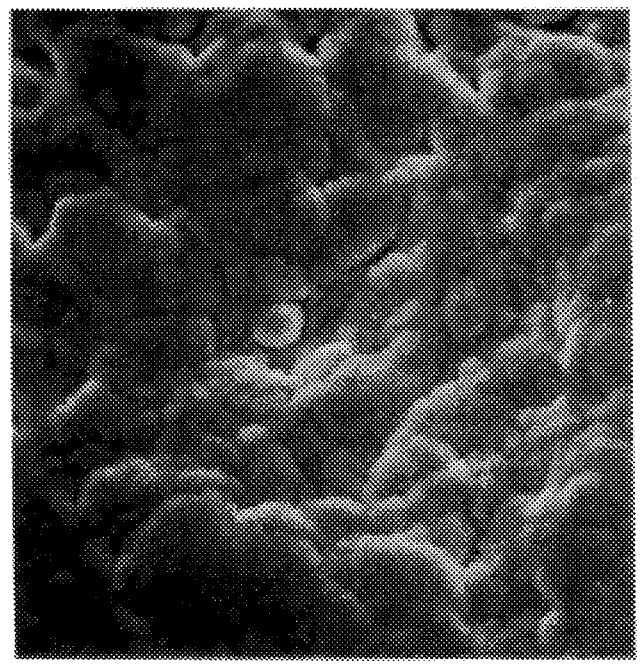
FIG. 2 is an SEM image of (a) a roughened YSZ surface, (b) a Ni—YSZ film deposited on polished YSZ at 20 mT, (c) a Ni—YSZ film deposited on roughened YSZ at 20 mT, and (d) a Ni—YSZ film deposited on roughened YSZ at 40 mT.
Figure 2D:
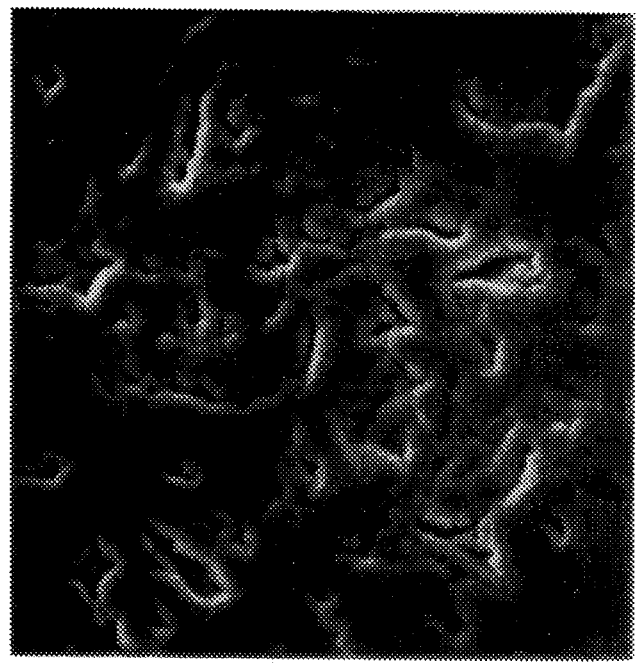

The morphologies of the films depended on the YSZ substrate morphology and ambient pressure during deposition, as illustrated by the typical SEM images of 2 μm-thick Ni—YSZ films in FIGS. 2B–D. Except for some nodules, surfaces of films deposited on polished YSZ were featureless on the scale observed by SEM, as shown in FIG. 2B for P=20 mT. This does not necessarily indicate high density, however, as porosity on a finer scale than observable by SEM may be present[12,13]. Films deposited at P=40 mT (FIG. 2D) showed poorer coverage of the roughened surface, as evidenced by the higher density of holes than in the film deposited at 20 mT (FIG. 2C). This is presumably a result of increased gas scattering of sputtered atoms leading to a broader impingement-angle distribution and hence poorer filling of substrate depressions.

Figure 3:
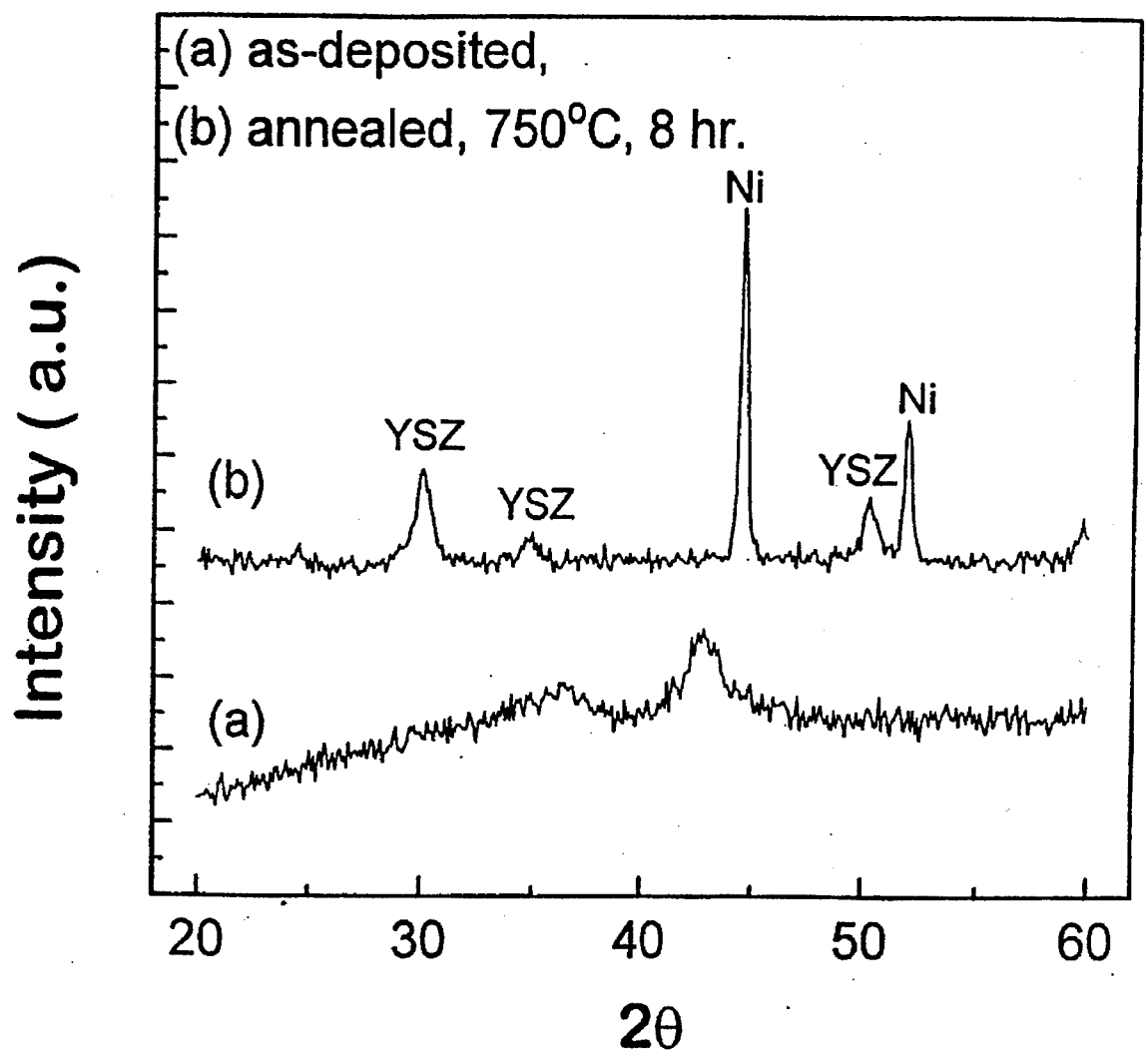
FIG. 3 is an x-ray diffractometer scans from (a) an as-deposited Ni—YSZ film and (b) after annealing at 750° C. for 8 hours in a 3%$H_2$+3%/$H_2O$+94%Ar mixture.

X-ray diffractometer scans from as-deposited Ni—YSZ films showed a broad peak around 43° and diffuse background, as illustrated in FIG. 3(a), indicating an amorphous or very-fine-grained polycrystalline structure. The peak matches with the most intense (520) reflection from a $Ni_7Zr_2$ compound, which has the same ratio of Ni and Zr as the target. This suggests that the oxygen partial pressure during deposition was not sufficient to fully oxidize the metals. After post-annealing at 750° C. in a 3%$H_2$+3%$H_2O$+94%Ar ambient for 8 hours, pronounced Ni and YSZ peaks were observed (FIG. 3(b)) indicating recrystallization. The peaks were relatively broad, even after the anneal, indicating a small grain size. Using a standard formula[14], the Ni grain size was estimated to be ≈35 nm, while that of YSZ was ≈20 nm.

Figure 4:
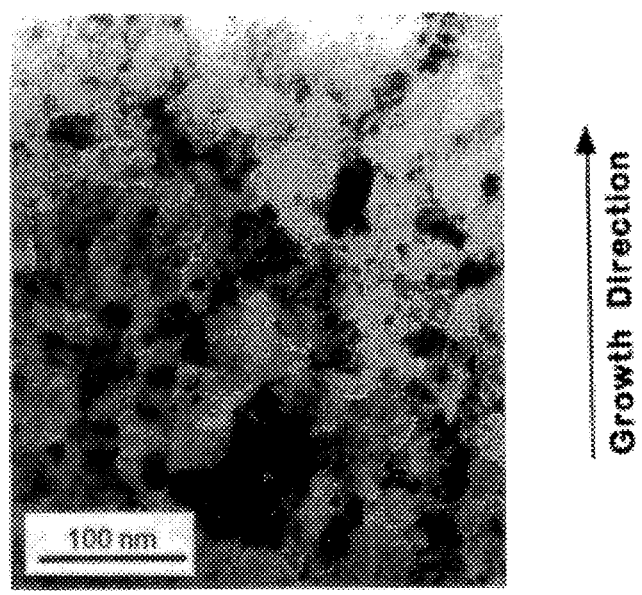
FIG. 4 is a cross-sectional SEM image of a Ni—YSZ film after annealing at 750° C. for 8 hours in a 3%$H_2$+3%$H_2O$+94%Ar mixture.
Figure 6A:
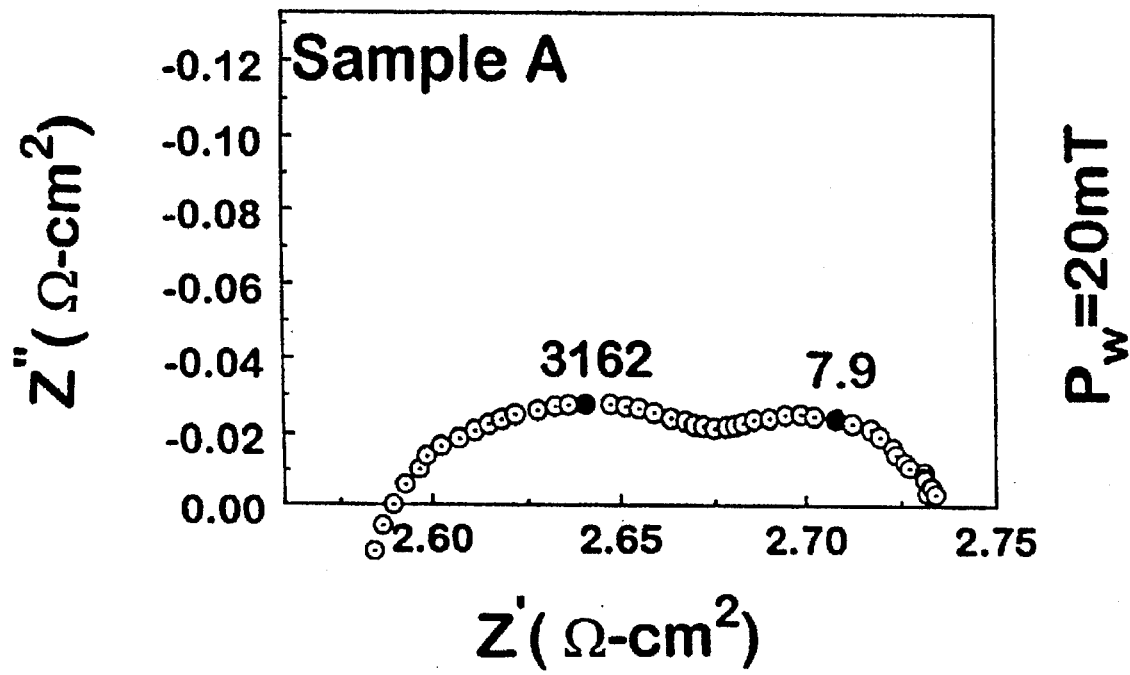
FIG. 6 is a plot of the imaginary versus real impedance of Ni—YSZ electrodes deposited on polished and roughened YSZ at P=20 and 40 mT, as listed in Table I (all measurements were carried out at 750° C. in 97% $H_2$+3%$H_2O$, and the numbers shown indicate the frequencies (Hz) at the tops of the arcs).
Figure 6B:
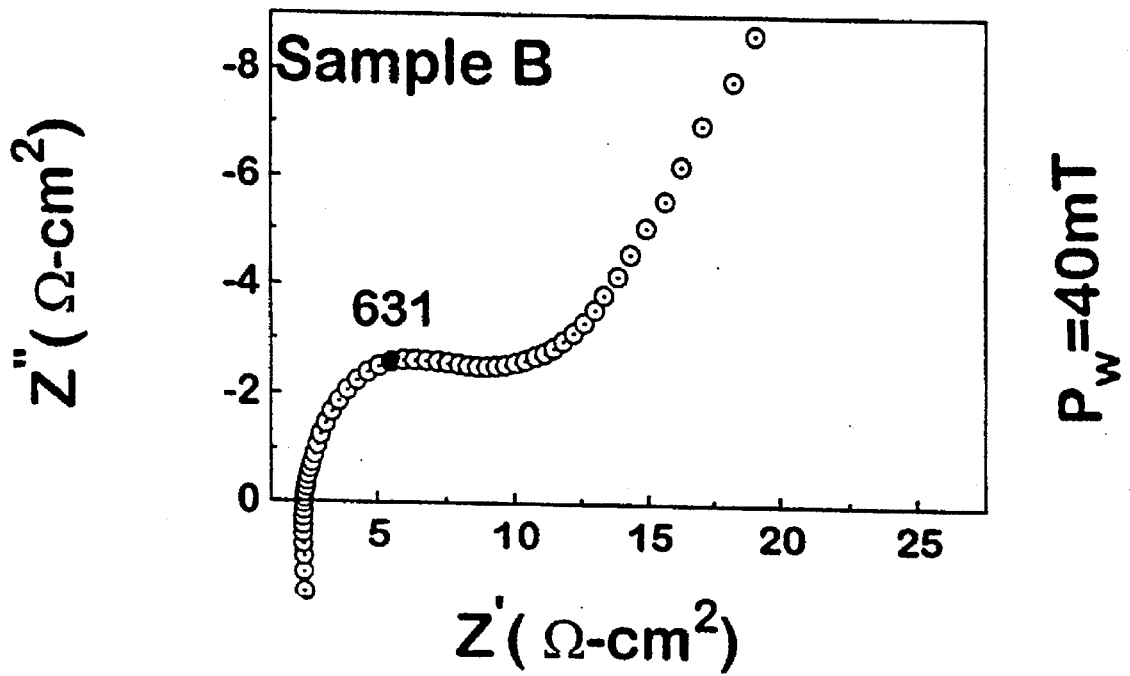
Figure 6C:
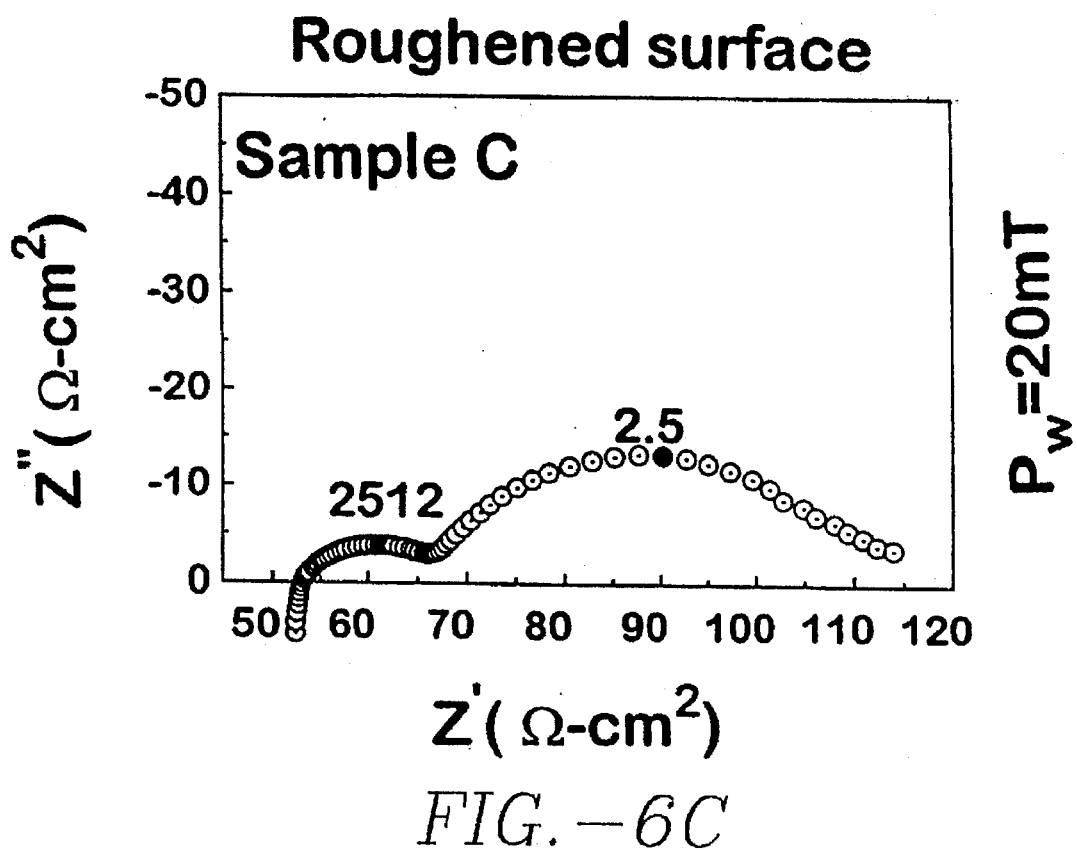
Figure 6D:
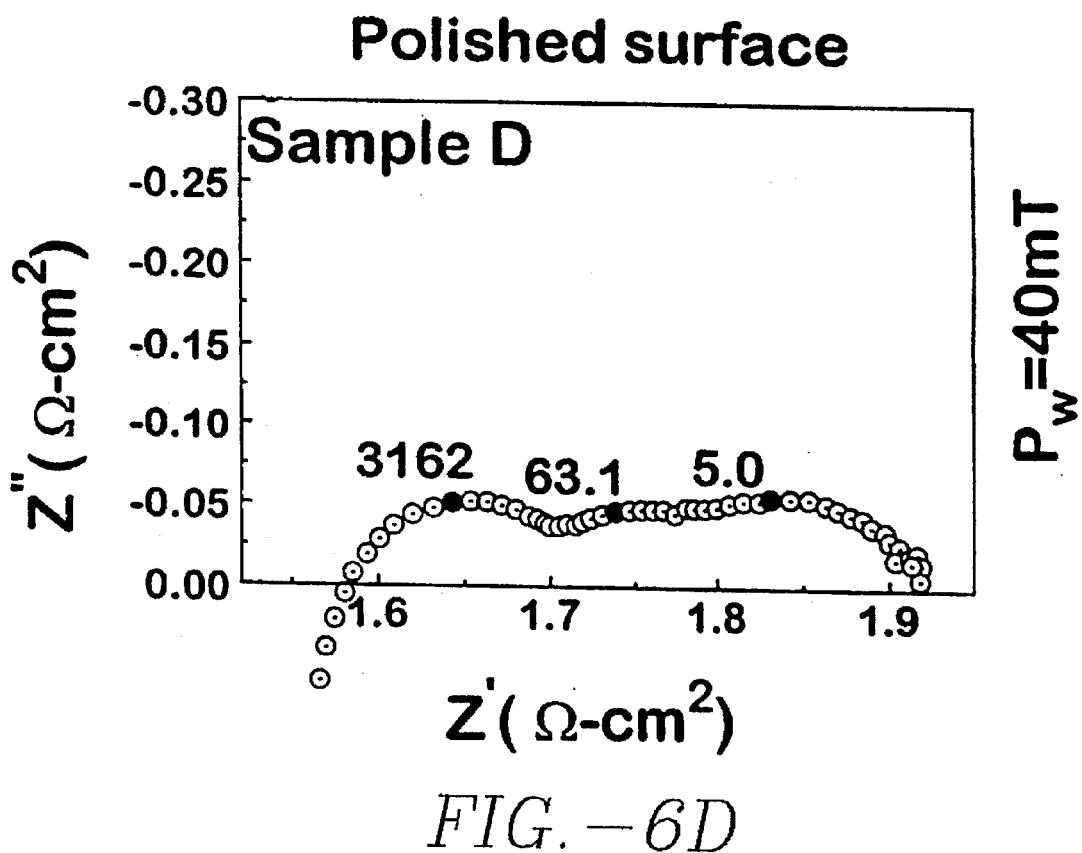

FIG. 4 is a bright-field cross-sectional TEM image of a typical Ni—YSZ film that was deposited on a polished YSZ substrate with P=20 mT, after annealing at 750° C. for 8 hours in 3%$H_2$+3%$H_2O$+94%Ar. The image shows grain boundary porosity. Ni and YSZ are not readily resolved in this image, but the size of Ni and YSZ regions was likely comparable to the average grain size, of ≈35 nm, consistent with the XRD-based determination of Ni and YSZ particle sizes. The ≈35 nm particle size is much less than particle sizes in bulk Ni—YSZ electrodes, typically >1 μm.¹ The equiaxed grain structure shown in FIG. 4 is likely from an initial columnar structure during the post-deposition annealing.

B. Electrical and Electrochemical Properties

The electrical conductivity of the Ni—YSZ films at 750° C. in 3%$H_2$+3%$H_2O$+94%Ar was ≈$10^3$ $Ω^{-1}cm^{-1}$, in the range expected for Ni—YSZ[12] and large enough for SOFC electrode applications.

FIGS. 5A and 5B show representative impedance spectra (IS) from Ni—YSZ films on YSZ measured at different temperatures T in different gas mixtures. Two arcs were normally found in the impedance spectra. FIG. 5A shows that the high-frequency arcs decreased rapidly with increasing T from 650° C. to 750° C. Analysis of the results showed an Arrhenius dependence with an apparent activation energy of 1.1 eV. Note that the low-frequency arcs decreased less (~35%) with increasing T. The increase in the high-frequency real-axis intercept with decreasing T was due to a decrease in electrolyte conductivity. FIG. 5B shows IS obtained in 97% $H_2$+3%$H_2O$ and 3%$H_2$+3%$H_2O$+94%Ar at T=750° C. The decrease in $H_2$ partial pressure P($H_2$) caused a significant increase in the low-frequency arc (~150%) but only a small change (~50%) in the high frequency arc. The results are in basic agreement with prior impedance spectroscopy studies of Ni—YSZ electrodes on YSZ at 1000° C. where two semi-circles have been reported.

FIG. 6 shows typical impedance spectra that illustrate the effects of substrate morphology and sputtering ambient pressure. The impedance spectra were measured immediately after heating the samples to 750°, because a gradual increase in the arc sizes was found over time (see section C). The interfacial resistance $r_i$ values, derived from the real axis intercepts of the complex plots, are listed in Table I.

TABLE I

| Sample | YSZ Substrate | Ar pressure (mT) | Initial $r_i$* (Ω-$cm^2$) |
|---|---|---|---|
| A | roughened | 20 | 0.15 |
| B | polished | 20 | >>20 |
| C | roughened | 40 | 60 |
| D | polished | 40 | 0.3 |

*Initial $r_i$ values were measured in 97% $H_2$ + 3% $H_2O$ at 750° C.

The film deposited on a roughened surface with P=20 mT (sample A) showed the lowest interfacial resistance of the four samples, 0.15 Ω-$cm^2$. Using the same deposition conditions but a polished substrate (sample B) led to much larger arcs. The low-frequency arc was particularly large, and exhibited a 45° slope over the range measured. This shape can be modeled as a Warburg impedance[15] indicating a resistance to mass transfer. While the $r_i$ value was not obtained because the intercept with the real axis was not observed, it was clearly >>20 $\Omega$-cm$^2$. On the other hand, increasing P to 40 mT (sample C) from the conditions shown in sample A resulted in a dramatic increase to $r_i$, to ≈50 $\Omega$cm$^2$. SEM images obtained after impedance testing showed that the film had cracked, leading to poor electrical contact within the electrode and hence a small effective electrode area. The cracking was presumably due to a high residual tensile stress resulting form the high deposition pressure. However, for P=40 mT and a polished substrate (sample D), a relatively small $r_i$ value, 0.33 $\Omega$-cm$^2$, was measured. The film was not cracked in this case, perhaps due to the polished surface leading to lesser porosity than in sample C.

These results can be summarized in terms of electrode morphology as follows. The large low-frequency Warburg arc for sample B suggests that performance was limited by mass transport, probably gas diffusion since the highest density was expected for this sample (see section A). This may indicate that the low-frequency arcs in the other samples were also related to diffusion. Low porosity also decreased the three-phase boundary length, increasing the high-frequency arc. Increasing the porosity either by roughening the substrate or increasing P yielded low $r_i$ values. However, any further improvements that might have been expected for even larger porosity (i.e. sample C with both a rough substrate and high P) were negated by cracking.

Note that the value of 0.15 $\Omega$-cm$^2$ of sample A at 750° C. was quite low, comparable even to values reported at 1000° C. for bulk Ni—YSZ. Dees et al.[1] have suggested that significant reduction in the interfacial resistance can be obtained by reducing the nickel particle separation which can be accomplished by reducing the nickel particle size. The present low $r_i$ values may thus be a result of the small (<100 nm) grain sizes of the sputtered Ni—YSZ compared with typical bulk electrode grain sizes (>1 μm).

C. SOFC Test Results

The performance of the sputtered Ni—YSZ anode was tested in thin-film SOFCs. ≈5 μm thick YSZ electrolyte thin films were deposited on bulk-ceramic LSM—YSZ support-electrodes, followed by thin (≈100 nm) yttria-doped ceria (YDC) electrolyte layers, and finally 2 μm thick Ni—YSZ layers. The YDC layer was used since it was found to improve fuel electrode performance and stability. These cells produced a maximum power density at 750° C. in air and 97%H$_2$-3%H$_2$O of 300 MW/cm$^2$. Increasing the temperature to 800° C. yielded ≈500 mW/cm$^2$. Note that Ni segregation to the surface of the Ni—YSZ layer was found after cell testing, in agreement with prior results.[16,17] The segregation did not affect the cell performance, however, as cell current densities stayed the same or even increased during SOFC testing over ≈100 hours.

Thus there has been provided an improved nickel and yttria-stabilized film having low interfacial resistance values. The film is particularly useful as the fuel electrode in solid-oxide fuel cells operated in the 600°–800° C. temperature range. The film is deposited from a single Ni—Zr—Y metal alloy target by DC reactive magnetron sputtering in a ArO$_2$ atmosphere.

What is claimed is:

1. A solid-oxide fuel cell having a solid electrolyte with a porous positive film on one surface of said electrolyte and a negative electrode fuel electrode film on the other surface of said electrolyte characterized in that said fuel electrode comprises a nickel and yttria-stabilized zirconia film, having uniformly distributed nickel and yttria stabilized zirconia grains less than 100 nm in size with the volume percent of nickel between 30 and 60.

2. A solid-oxide fuel cell as in claim 1 wherein said fuel electrode film is a porous film formed by DC reactive magnetron sputtering from a metallic nickel-zirconium-yttrium target in a Ar—O$_2$ atmosphere with O$_2$ partial pressure of 0.6 T and total pressure between 30 and 40 mT.

3. The method of forming a negative electrode fuel electrode film on the solid electrolyte of a solid-oxide fuel cell which comprises the steps of forming a metallic nickel-zirconia-yttrium target, subjecting the target to DC reactive magnetron sputtering in an argon oxygen atmosphere to sputter a uniform nickel and yttria-stabilized zirconia film on the surface of the solid electrolyte.

4. The method of claim 3 wherein the oxygen partial pressure is at least 0.6 mT and the total pressure is between 20 and 40 mT.

5. The method of claim 3 wherein the metallic nickel-zirconia-yttrium target has a composition of 68.8 wt % Ni, 26.6 wt % Zr and 4.52 wt % Y.

* * * * *